United States Patent
Chiu et al.

(10) Patent No.: US 9,299,649 B2
(45) Date of Patent: Mar. 29, 2016

(54) 3D PACKAGES AND METHODS FOR FORMING THE SAME

(71) Applicant: Taiwan Semiconductor Manufacturing Company, Ltd., Hsin-Chu (TW)

(72) Inventors: Tzu-Wei Chiu, Hsin-Chu (TW);
Cheng-Hsien Hsieh, Kaohsiung (TW);
Hsien-Pin Hu, Zhubei (TW);
Kuo-Ching Hsu, Chung-Ho (TW);
Shang-Yun Hou, Jubei (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 72 days.

(21) Appl. No.: 13/763,335

(22) Filed: Feb. 8, 2013

(65) Prior Publication Data

US 2014/0225258 A1     Aug. 14, 2014

(51) Int. Cl.
| | |
|---|---|
| H01L 23/12 | (2006.01) |
| H01L 23/053 | (2006.01) |
| H01L 23/498 | (2006.01) |
| H01L 21/683 | (2006.01) |
| H01L 21/56 | (2006.01) |

(52) U.S. Cl.
CPC ...... *H01L 23/49816* (2013.01); *H01L 21/6835* (2013.01); *H01L 23/49827* (2013.01); *H01L 23/49894* (2013.01); *H01L 21/56* (2013.01); *H01L 23/49811* (2013.01); *H01L 2221/68318* (2013.01); *H01L 2221/68345* (2013.01); *H01L 2221/68381* (2013.01); *H01L 2224/13* (2013.01); *H01L 2224/73204* (2013.01)

(58) Field of Classification Search
CPC . H05K 3/429; H05K 1/112; H05K 2201/096; H01L 2924/01078; H01L 2924/15311; H01L 2924/01079; H01L 23/49811; H01L 2224/97; H01L 21/44; H01L 21/56; H01L 224/97; H01L 23/28; H01L 23/31
USPC .......... 257/E23.062, E23.175, 668, 698, 738, 257/739, 700, 758, 773, 774, 776; 174/250, 174/258, 260–262, 264, 266; 361/792, 767, 361/720, 809, 810; 438/118, 667, 123
See application file for complete search history.

(56) References Cited

U.S. PATENT DOCUMENTS

| | | | |
|---|---|---|---|
| 6,418,615 B1 | 7/2002 | Rokugawa et al. | |
| 6,905,914 B1 | 6/2005 | Huemoeller et al. | |
| 7,093,356 B2 * | 8/2006 | Imafuji et al. | 29/847 |
| 7,185,429 B2 * | 3/2007 | Kusano et al. | 29/852 |
| 7,285,856 B2 * | 10/2007 | Ooi et al. | 257/739 |
| 7,397,000 B2 * | 7/2008 | Shimoto et al. | 174/258 |

(Continued)

*Primary Examiner* — Dale E Page
(74) *Attorney, Agent, or Firm* — Slater & Matsil, L.L.P.

(57) ABSTRACT

Embodiments of the present disclosure include a semiconductor device and methods of forming a semiconductor device. An embodiment is a semiconductor device comprising an interconnecting structure consisting of a plurality of thin film layers and a plurality of metal layers disposed therein, each of the plurality of metal layers having substantially a same top surface area, and a die comprising an active surface and a backside surface opposite the active surface, the active surface being directly coupled to a first side of the interconnecting structure. The semiconductor device further comprises a first connector directly coupled to a second side of the interconnecting structure, the second side being opposite the first side.

22 Claims, 16 Drawing Sheets

(56) References Cited

U.S. PATENT DOCUMENTS

| | | | |
|---|---|---|---|
| 7,435,680 B2* | 10/2008 | Nakamura et al. | 438/678 |
| 7,696,613 B2* | 4/2010 | Nakamura et al. | 257/668 |
| 7,902,660 B1 | 3/2011 | Lee et al. | |
| 8,334,461 B2* | 12/2012 | Taguchi et al. | 174/252 |
| 8,530,751 B2* | 9/2013 | Maeda et al. | 174/258 |
| 8,609,998 B2* | 12/2013 | Miyasaka et al. | 174/262 |
| 8,802,504 B1 | 8/2014 | Hou et al. | |
| 9,048,231 B2 | 6/2015 | Hou et al. | |
| 2004/0004293 A1 | 1/2004 | Murayama | |
| 2005/0088833 A1 | 4/2005 | Kikuchi et al. | |
| 2007/0045780 A1* | 3/2007 | Akram | H01L 21/76898 257/621 |
| 2008/0298038 A1* | 12/2008 | Kaneko | 361/808 |
| 2009/0052150 A1* | 2/2009 | Kobayashi | H05K 3/28 361/767 |
| 2009/0242262 A1* | 10/2009 | Asano | 174/267 |
| 2011/0000706 A1* | 1/2011 | Shomura et al. | 174/262 |
| 2011/0005824 A1* | 1/2011 | An et al. | 174/261 |
| 2011/0024898 A1* | 2/2011 | Leung | B32B 37/02 257/734 |
| 2011/0201151 A1 | 8/2011 | Gambino et al. | |
| 2013/0062761 A1 | 3/2013 | Lin et al. | |

* cited by examiner

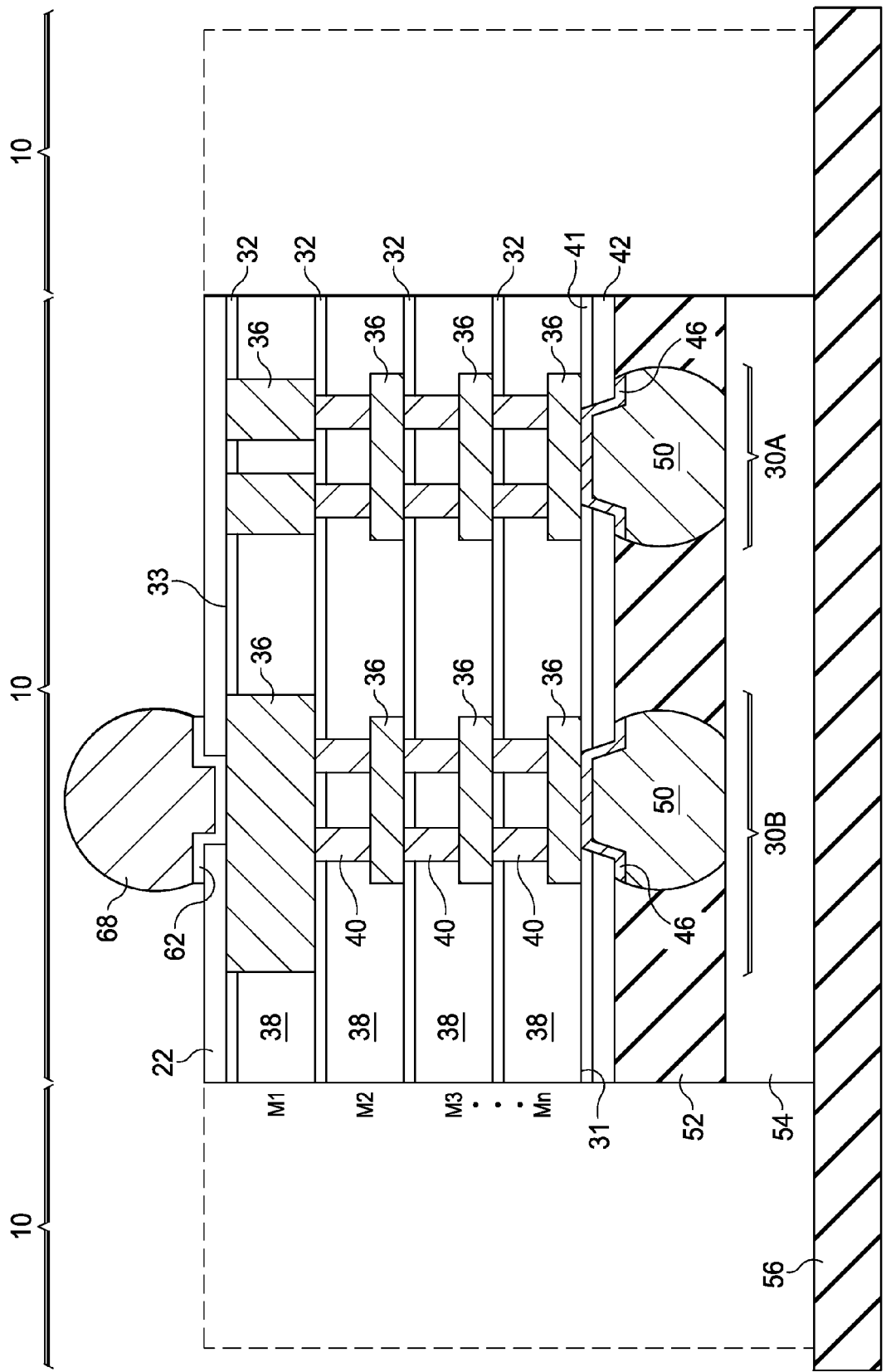

3D PACKAGES AND METHODS FOR FORMING THE SAME

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. In addition, when more devices are put into one chip or die, more complex designs are required.

In an attempt to further increase circuit density, three-dimensional (3D) ICs have been investigated. In a typical formation process of a 3D IC, two or more dies or chips are bonded together and electrical connections are formed between each die or chip and contact pads on a substrate.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 2A through 2H illustrate intermediate stages of forming a semiconductor device according to an embodiment;

DETAILED DESCRIPTION OF ILLUSTRATIVE EMBODIMENTS

Figure 1:
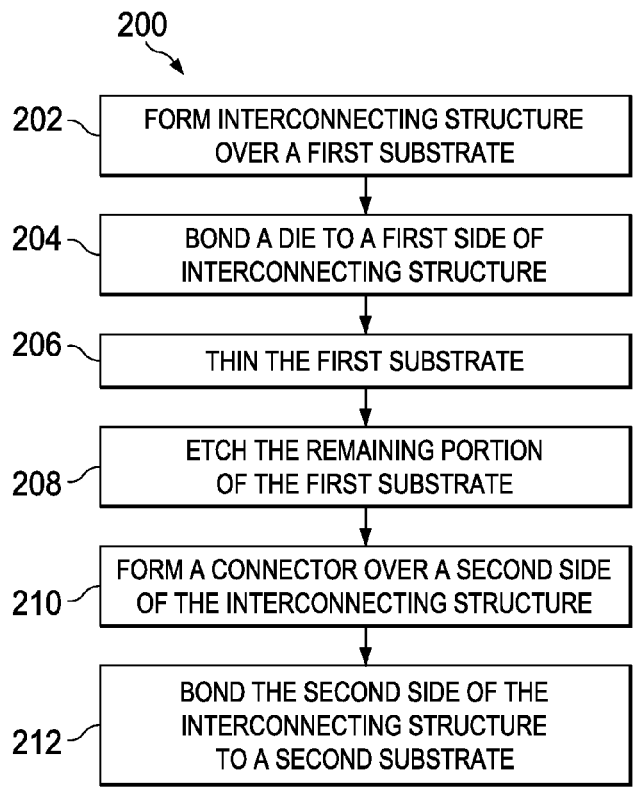
FIG. 1 illustrates a flow diagram of a method for manufacturing a semiconductor device according to an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a semiconductor device with an interconnecting structure without a substrate and without through substrate vias. Other embodiments may also be applied, however, to other interconnecting structures.

In a formation process of a 3D IC, two or more dies or chips are bonded together and electrical connections are formed between each die or chip and contact pads on a substrate. For example, interposer stacking is part of 3D IC technology, where a through substrate via (TSV) embedded interposer is connected to a device chip or die with a micro bump. Interposer stacking manufacturing process flows can be separated into at least two types. In a first type, a chip-on-chip-on-substrate (CoCoS) process flow, a silicon interposer chip is first mounted onto a packaging substrate, and then a different device silicon chip is bonded onto the interposer. In a second type, a chip-on-wafer-on-substrate (CoWoS) process flow, a device silicon chip is first bonded onto a silicon interposer wafer, which is then diced. The resulting stacked silicon is then mounted onto a substrate.

FIG. 1 illustrates a flow diagram of a method 200 for manufacturing a semiconductor device in accordance with an embodiment. While method 200 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The operations of method 200 will be described with reference to FIGS. 2A through 2H as an example, although the method 200 may be applied to other embodiments. At operation 202, an interconnecting structure is formed over a first substrate. Operation 202 is illustrated in FIGS. 2A and 2B as described below.

Figure 2A:
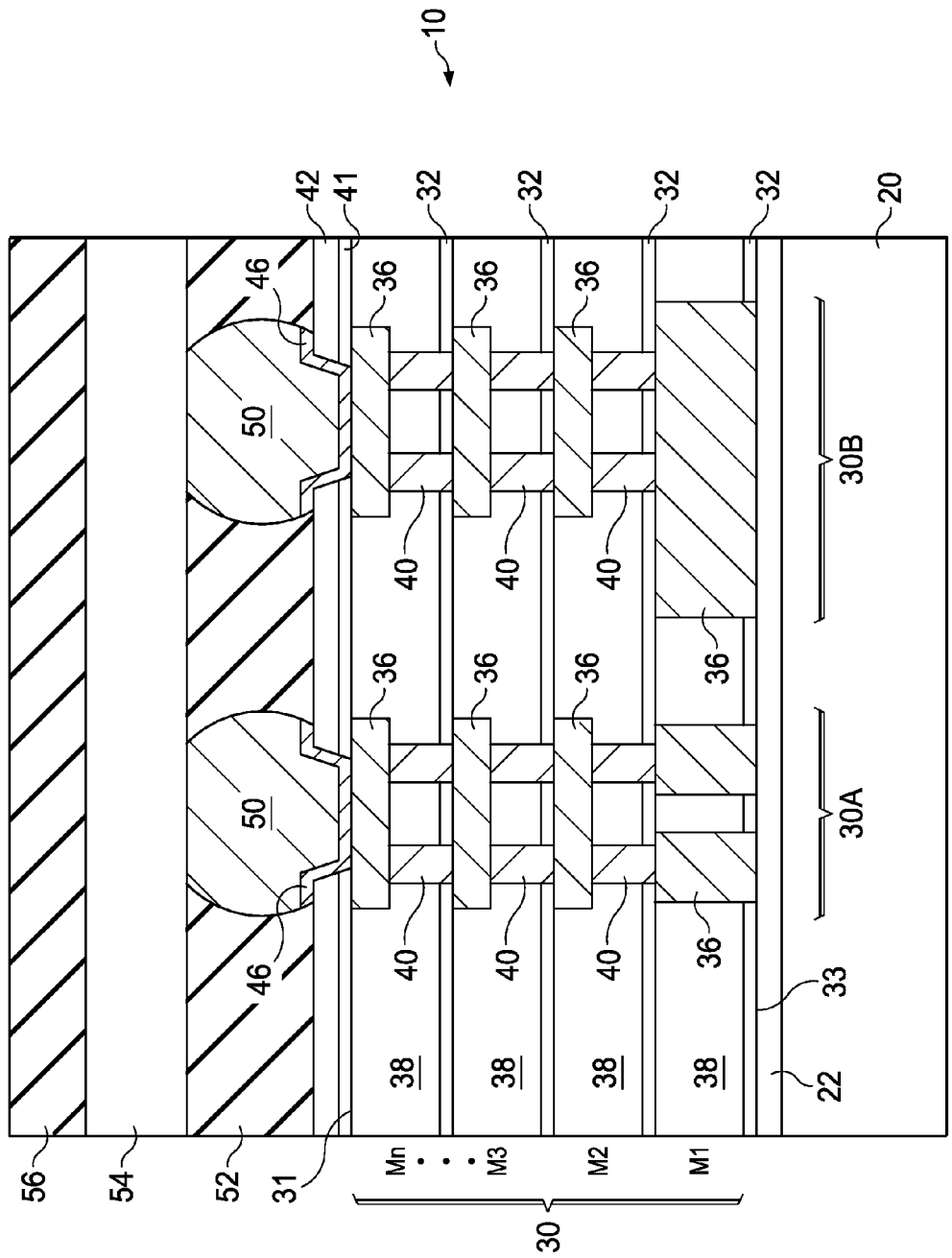
Figure 2B:
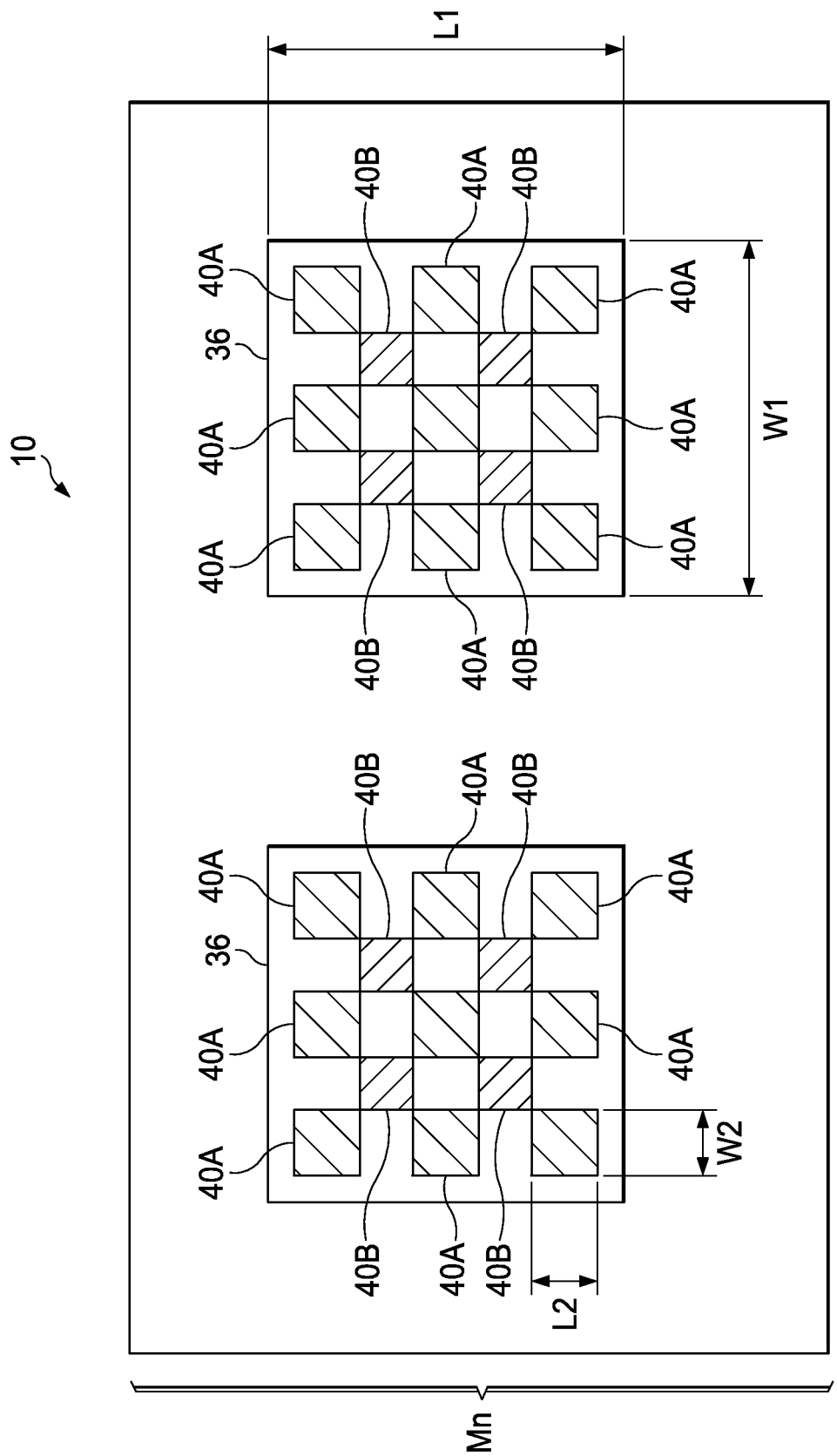

Referring to FIG. 2A, a semiconductor device 10 at an intermediate stage of processing is illustrated. The semiconductor device 10 includes a passivation layer 22 formed on a first substrate 20, an interconnecting structure 30 formed on the passivation layer 22, a die 54 bonded to a first side 31 of the interconnecting structure 30 with connectors 50 on under bump metallizations (UBMs) 46, and a carrier 56 mounted to the die 54.

The first substrate 20 may be formed of a semiconductor material, such as silicon, silicon germanium, silicon carbide, gallium arsenide, or other commonly used semiconductor materials. Alternatively, the first substrate 20 is formed of a dielectric material, such as glass, aluminum oxide, aluminum nitride, the like, or a combination thereof. The first substrate 20 is free from active devices (such as transistors and diodes) and passive devices (such as inductors, resistors, and capacitors).

The passivation layer 22 is formed over the first substrate 20. The passivation layer 22 can be silicon nitride, silicon carbide, silicon oxide, low-k dielectrics such as carbon doped oxides, extremely low-k dielectrics such as porous carbon doped silicon dioxide, a polymer, such as an epoxy, polyimide, benzocyclobutene (BCB), polybenzoxazole (PBO), the like, or a combination thereof, although other relatively soft, often organic, dielectric materials can also be used, and deposited by chemical vapor deposition (CVD), physical vapor deposition (PVD), atomic layer deposition (ALD), a spin-on-dielectric process, the like, or a combination thereof. In some embodiments, the passivation layer 22 is a polymer such as polyimide.

The interconnecting structure 30 comprises a plurality of thin film layers with a plurality of metal layers disposed therein. The plurality of thin film layers include inter-metal dielectrics (IMDs) 38 and etch stop layers 32. The plurality of metal layers include metal lines 36 and vias 40. The metal lines 36 and vias 40 may electrically connect the die 54 on a first side 31 of the interconnecting structure 30 with various devices and/or substrates on a second side 33 of the interconnecting structure 30 to form functional circuitry (see FIG. 2H). The IMDs 38 may be formed of oxides such as silicon oxide, borophosphosilicate glass (BPSG), undoped silicate glass (USG), fluorinated silicate glass (FSG), low-k dielectric materials, the like, or a combination thereof. Different respective IMDs may comprise different materials. The low-k dielectric materials may have k values lower than 3.9. In some embodiments, the low-k dielectric materials have a k value less than 3.0 or even less than 2.5. In some other embodiments, the low-k dielectric materials have a k value less than 2.0. The etch stop layers 32 can be silicon nitride, silicon carbide, silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof. Conductive materials, such as copper, aluminum, titanium, the like, or a combination thereof, with or without a barrier layer, can be used as the metal lines 36 and the vias 40. In an embodiment, each of the metal layers M1 through Mn have a thickness in a range from about 5.0 kÅ to about 30.0 kÅ.

Interconnecting structure 30 includes a plurality of metal layers, namely M1, M2, M3, and Mn, wherein metal layer M1 is the metal layer immediately above the passivation layer 22, while metal layers M2 and M3 are intermediate layers above metal layer M1, and metal layer Mn is the metal layer that is immediately under the overlying UBMs 46, wherein the value n of Mn is greater than or equal to two. The metal layer Mn may be referred to as a metal pad or a contact pad. Throughout the description, the term "metal layer" refers to the collection of the metal lines in the same layer, and the term "metal layer" does not include a through substrate via (TSV). Metal layers M1 through Mn are formed in the IMDs 38.

As illustrated in FIG. 2A, the interconnecting structure 30 may comprise a first portion 30A and a second portion 30B. The first portion 30A has a non-continuous metal line 36 of the metal layer M1, and the second portion 30B has metal pad in the metal line 36 of metal layer M1 that may be larger than the metal lines 36 in the other layers. In other embodiments, other layers M2 through Mn may have metal lines 36 that are larger metal lines 36 in metal layer M1. The metal pad in the second portion 30B may have a connector formed over it in subsequent processing (see FIG. 2G). In some embodiments, both the first and second portions 30A and 30B may comprise metal pads in the metal lines 36 of metal layer M1 and each may have connectors formed the metal pads (see FIGS. 6A through 6D).

In an embodiment, the metal line 36 of metal layer M1 has a surface substantially coplanar with the second side 33 of the interconnecting structure 30, and the metal line 36 of the metal layer Mn has a surface substantially coplanar with the first side 31 of the interconnecting structure 30. There may be ten vias 40 or up to N vias 40 connecting the adjacent metal lines 36 rather than the two vias 40 illustrated in FIG. 2A or the nine vias 40 illustrated in FIG. 2B. The large number of vias 40 in each metal layer may be used to lower the resistance between the connectors 50 and the connectors 68 (see FIG. 2G), to improve heat dissipation in the interconnecting structure 30, and/or for structural support in the interconnecting structure 30.

The metal layers, M1, M2, M3, and Mn may be formed using a single and/or a dual damascene process, a via-first process, or a metal-first process. Damascene means formation of a patterned layer embedded in another layer such that the top surfaces of the two layers are coplanar. A damascene process which creates either only trenches or vias is known as a single damascene process. A damascene process which creates both trenches and vias at once is known as a dual damascene process.

In an exemplary embodiment, the metal layers M1 through Mn are formed using a dual damascene process. In this example, the formation of the M1 layer may begin with the formation of an etch stop layer 32 on the passivation layer 22 and with an IMD 38 on the etch stop layer 32. Once the IMD 38 is deposited, portions of the IMD 38 may be etched away to form recessed features, such as trenches and vias, which can be filled with conductive material to connect different regions of the interconnecting structure 30 and accommodate the metal lines 36 and vias 40. This process may be repeated for the remaining metal layers M2 through Mn.

The number of metal layers M1 to Mn, the number of IMDs 38, the number of vias 40, and the number of metal lines 36 are only for illustrative purposes and are not limiting. There could be other number of layers that is more or less than the four metal layers illustrated. There may be other number of IMD layers, other number of vias, and other number of metal lines different from those illustrated in FIG. 2A.

FIG. 2B illustrates a top-view of the interconnecting structure 30 from above metal layer Mn according to an embodiment. As illustrated in FIG. 2B, the vias 40A are in the metal layer Mn and the vias 40B are in the next lower metal layer M3. In an embodiment, the metal lines 36 have a width W1 from about 10 μm to about 30 μm and a length L1 from about 10 μm to about 30 μm. Further the vias 40 have a width W2 in a range from about 0.5 μm to about 1.5 μm and a length L2 from about 0.5 μm to about 1.5 μm. In an embodiment in which the vias 40A are circular, the width W2 or the length L2 may be considered a diameter. FIG. 2B illustrates that each metal line 36 has nine vias 40A interconnecting the metal line 36 to the next metal line 36 in the metal layer above and/or below the metal line 36, although other embodiments may have more or less vias 40 in each metal layer. As illustrated in FIG. 2B, in some embodiments, the vias 40B of a lower metal layer are not aligned (offset) from the vias 40A of metal layer Mn and the vias 40B may be a different size than vias 40A. Although only metal layer Mn is visible in FIG. 2B, in some embodiments, all the metal layers, M1 through M3, below the illustrated metal layer Mn are substantially vertically aligned such that the metal lines 36 and vias 40 of the lower metal layers are the same as the illustrated metal layer Mn. In some embodiments, a top surface area of the metal lines 36 in each of the metal layers may be substantially equal to each of the other metal layers of the interconnecting structure 30. In other embodiments, the metal layers M1 through Mn are not aligned and have different top surface areas. Although FIG. 2B illustrates the metal lines 36 and the vias 40A and 40B having a square shape, the metal lines 36 and the vias 40A and 40B may be any suitable shape such as, a circle, a rectangle, a hexagon, other polygons, or the like.

At operation 204, a die is bonded to a first side of the interconnecting structure. Operation 204 is illustrated in FIG. 2A as described below.

Referring back to FIG. 2A, after the formation of the interconnecting structure 30, a first passivation layer 41 and a second passivation layer 42 may be formed to cover and protect the metal lines 36 and the interconnecting structure 30. The first and second passivation layers 41 and 42 may be similar to the passivation layer 22 discussed above and will not be repeated herein, although the passivation layer 22 and the first and second passivation layers 41 and 42 need not be the same.

After the formation of the second passivation layer 42, openings may be formed through the second passivation layer 42 and the first passivation layer 41 to expose portions of the metal lines 36 of metal layer Mn. The openings allow for electrical and physical coupling between metal lines 36 of metal layer Mn of the interconnecting structure 30 and the subsequently formed UBMs 46. These openings may be formed using a suitable photolithographic mask and etching process, although any suitable process to expose portions of the metal lines 36 of metal layer Mn may be used.

After the openings are formed through the first and second passivation layers 41 and 42, the UBMs 46 may be formed along the second passivation layer 42 and in the openings over the metal lines 36 of metal layer Mn. In an embodiment the UBMs 46 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM 46. Any suitable materials or layers of material that may be used for the UBMs 46 are fully intended to be included within the scope of the current application.

The UBMs 46 may be created by forming each layer over the second passivation layer 42 and along the interior of the openings through the first and second passivation layers 41 and 42 to the metal lines 36 of the metal layer Mn. The forming of each layer may be performed using a plating process, such as electrochemical plating, although other processes of formation, such as sputtering, evaporation, or plasma-enhanced CVD (PECVD) process, may alternatively be used depending upon the desired materials. Once the desired layers have been formed, portions of the layers may then be removed through a suitable photolithographic masking and etching process to remove the undesired material and to leave the UBMs 46 in a desired shape, such as a circular, octagonal, square, or rectangular shape, although any desired shape may alternatively be formed.

After the UBMs 46 are formed, an active surface of the die 54, the active surface comprising the connectors 50, is bonded to a first side 31 of the interconnecting structure 30 by way of the connectors 50 and the UBMs 46. The die 54 may be a device die comprising integrated circuit devices, such as transistors, capacitors, inductors, resistors (not shown), and the like, therein. Further, the die 54 may be a logic die comprising core circuits, and may be, for example, a central processing unit (CPU) die. In some embodiments, the die 54 may comprise multiple stacked dies like a memory stacking. The connectors 50 may be bonded to contacts or bond pads (not shown) on the die 54.

The connectors 50 are illustrated as micro bumps in FIG. 2A, however in other embodiments, the connectors 50 may be solder balls, metal pillars, controlled collapse chip connection (C4) bumps, electroless nickel-electroless palladium-immersion gold technique (ENEPIG) formed bumps, or the like. The connectors 50 may comprise a conductive material such as copper, aluminum, gold, nickel, silver, palladium, tin, the like, or a combination thereof. In an embodiment in which the connectors 50 are tin solder bumps, the connectors 50 may be formed by initially forming a layer of tin through such commonly used methods such as evaporation, electroplating, printing, solder transfer, ball placement, or the like. Once a layer of tin has been formed on the structure, a reflow may be performed in order to shape the material into the desired bump shape. In another embodiment the connectors 50 may be metal pillars (such as copper pillars), which may be pre-formed before the die 54 is placed over the interconnecting structure 30. The metal pillars may be formed by a plating process and may be solder free and comprise substantially vertical sidewalls. In this embodiment, the UBMs 46 may be omitted as the metal pillars may extend from the metal lines 36 to the die 54.

The bonding between the die 54 and the interconnecting structure 30 may be a solder bonding or a direct metal-to-metal (such as a copper-to-copper or tin-to-tin) bonding. In an embodiment, the die 54 may be bonded to the interconnecting structure 30 by a reflow process. During this reflow process, the connectors 50 are in contact with the UBMs 46 to physically and electrically couple the die 54 to the interconnecting structure 30.

An underfill material 52 may be injected or otherwise formed in the space between the die 54 and the interconnecting structure 30. The underfill material 52 may, for example, comprise a liquid epoxy, deformable gel, silicon rubber, or the like, that is dispensed between the die 54 and the interconnecting structure 30, and then cured to harden. This underfill material 52 is used, among other things, to reduce cracking in and to protect the connectors 50.

A carrier 56 may then be mounted to a backside surface of the die 54 through an adhesive layer (not shown). The adhesive layer may be disposed, for example laminated, on the carrier 56. The adhesive layer (not shown) may be formed of a glue, such as an ultra-violet glue, or may be a lamination layer formed of a foil. The carrier 56 may be any suitable substrate that provides (during intermediary operations of the fabrication process) mechanical support for the layers on top. The carrier 56 may comprise a wafer comprising glass, silicon (e.g., a silicon wafer), silicon oxide, metal plate, a ceramic material, or the like.

At operation 206, the first substrate 20 is thinned. Operation 206 is illustrated in FIG. 2C as described below.

Figure 2C:
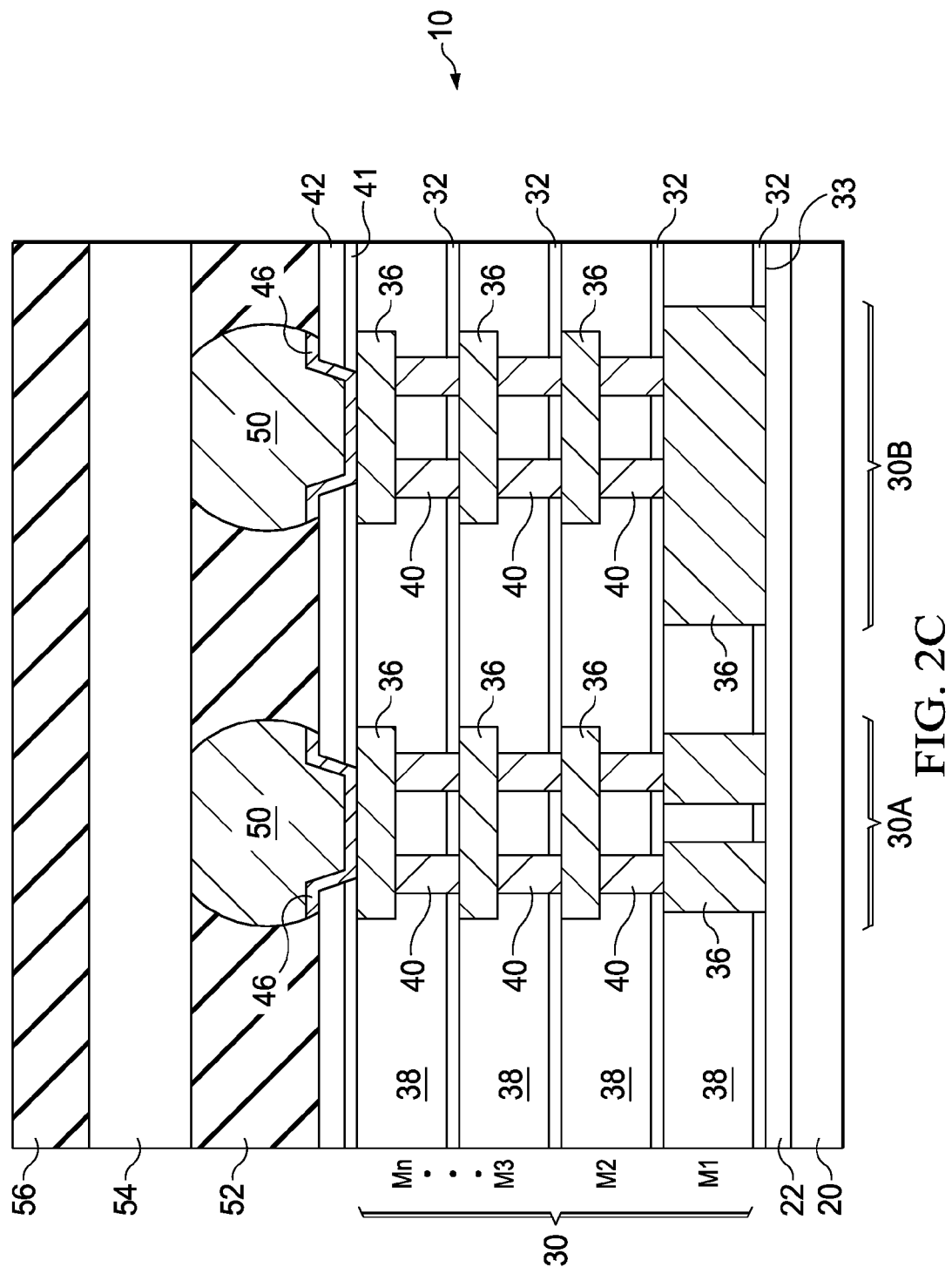

FIG. 2C illustrates the thinning of the backside surface of the first substrate 20. The thinning process may be performed using an etching process, a chemical mechanical polishing (CMP) process, and/or a planarization process, such as a grinding process.

At operation 208, the remaining portion of the first substrate is removed. Operation 208 is illustrated in FIG. 2D as described below.

Figure 2D:
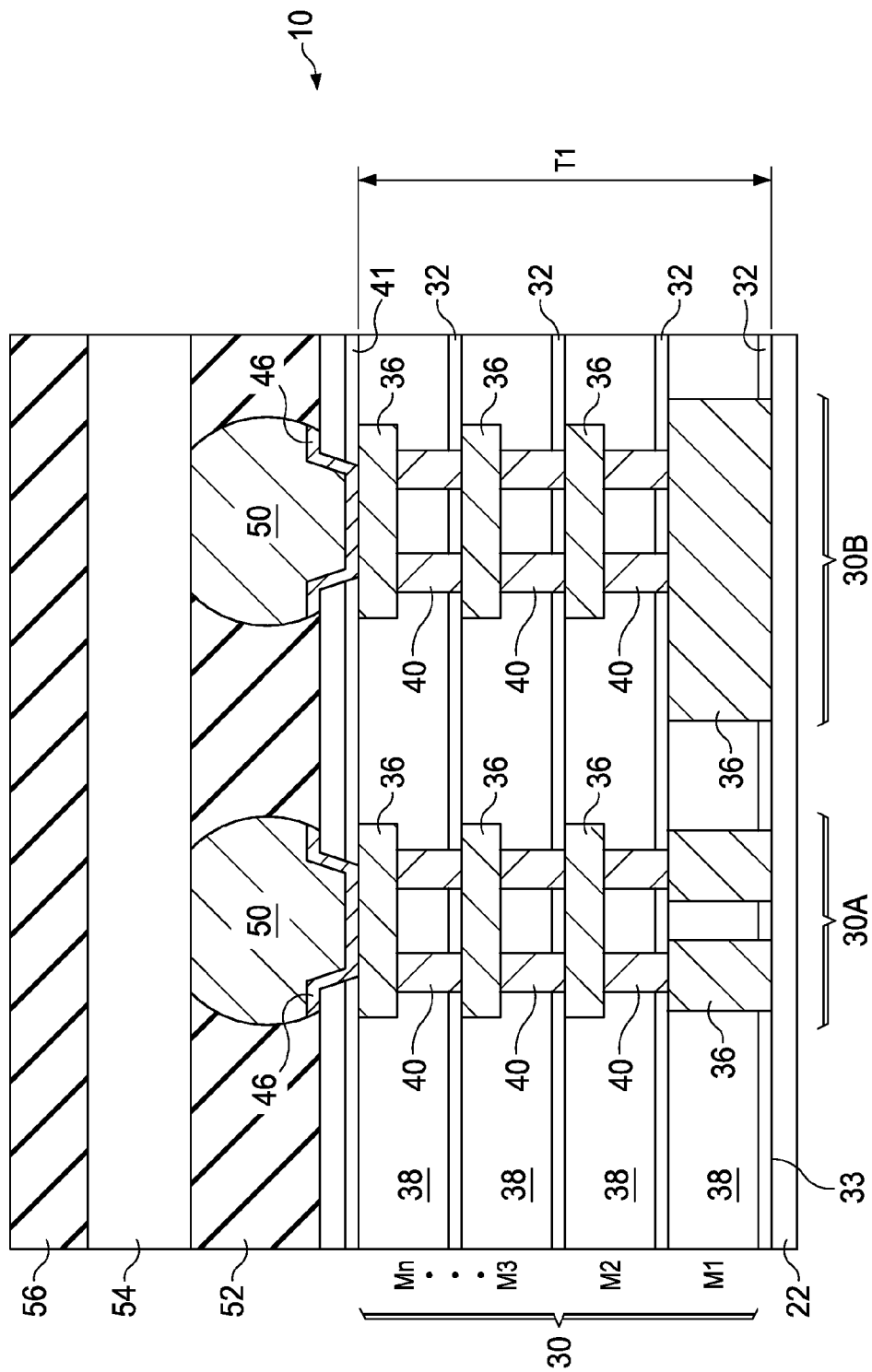

FIG. 2D illustrates the removal of the remaining portion of the first substrate 20. The remaining portion of the first substrate 20 may be removed by a wet etch process that is selective to the first substrate 20. In an embodiment, the selective wet etch comprises an etchant comprising tetramethylammonium hydroxide (TMAH) as it enables selective crystallographic etching of silicon. In another embodiment, the selective wet etch comprises HF and $HNO_3$. The selective wet etch removes the remaining portion of the first substrate 20 to expose the passivation layer 22. In an embodiment, the interconnecting structure 30 has a thickness T1 in a range from about 3 μm to about 10 μm. In another embodiment, the interconnecting structure 30 may have a thickness T1 in a range from about 3 μm to about 30 μm.

With the removal of the first substrate 20, the interconnecting structure 30 may provide an interface and structure to couple the die 54 on its first side 31 to one or more devices and/or substrates on its second side 33. In some embodiments, the interconnecting structure 30 is free from a substrate and is also free from through substrate vias (TSVs). This provides for an interconnecting structure 30 that may be thinner than a structure with a substrate and also an interconnecting structure 30 that costs less to manufacture than a structure with TSVs. Further, the interconnecting structure 30 is more flexible and can bend (warp) and may accommodate the stresses and forces of subsequent processing (e.g. bonding the die 54 to the interconnecting structure 30) better than a structure with a substrate.

At operation 210 a connector is formed over the second side 33 of the interconnecting structure 30. Operation 210 is illustrated in FIGS. 2E through 2G as described below.

Figure 2E:
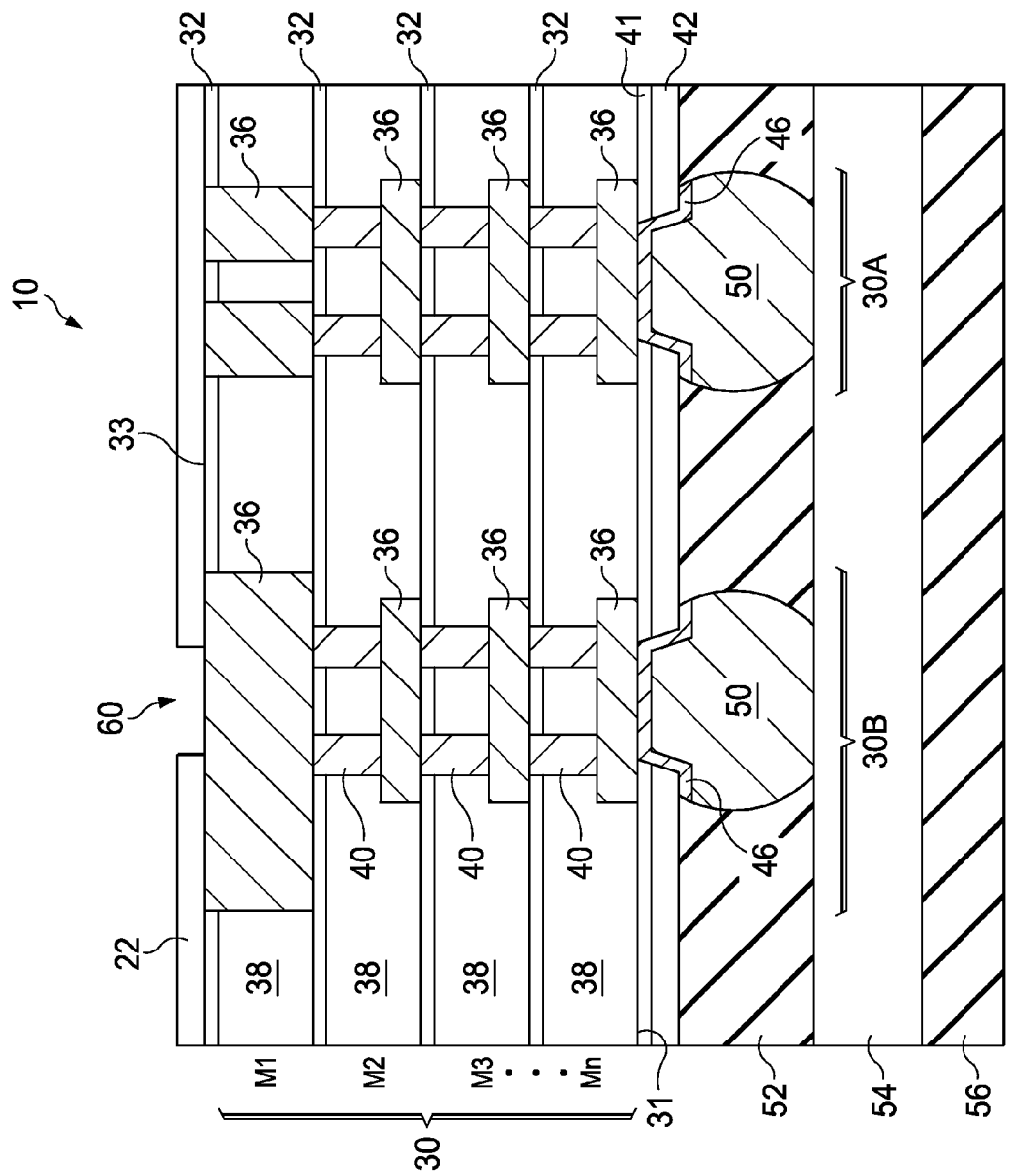

FIG. 2E illustrates the formation of an opening over the second side of the interconnecting structure. In FIG. 2E, the semiconductor device 10 has been flipped over so that the carrier 56 is towards the bottom of the figure. An opening 60 may be formed through the passivation layer 22 to expose a portion the metal line 36 of metal layer M1. The opening 60 allows for electrical and physical contact between the metal lines 36 of metal layer M1 of the interconnecting structure 30 and the subsequently formed connector 68, wherein the connector 68 includes a seed layer 62 (see FIG. 2G). The opening 60 may be formed using a suitable photolithographic mask and etching process, although any suitable process to expose a portion of the metal line 36 of metal layer M1 may be used.

Figure 2F:
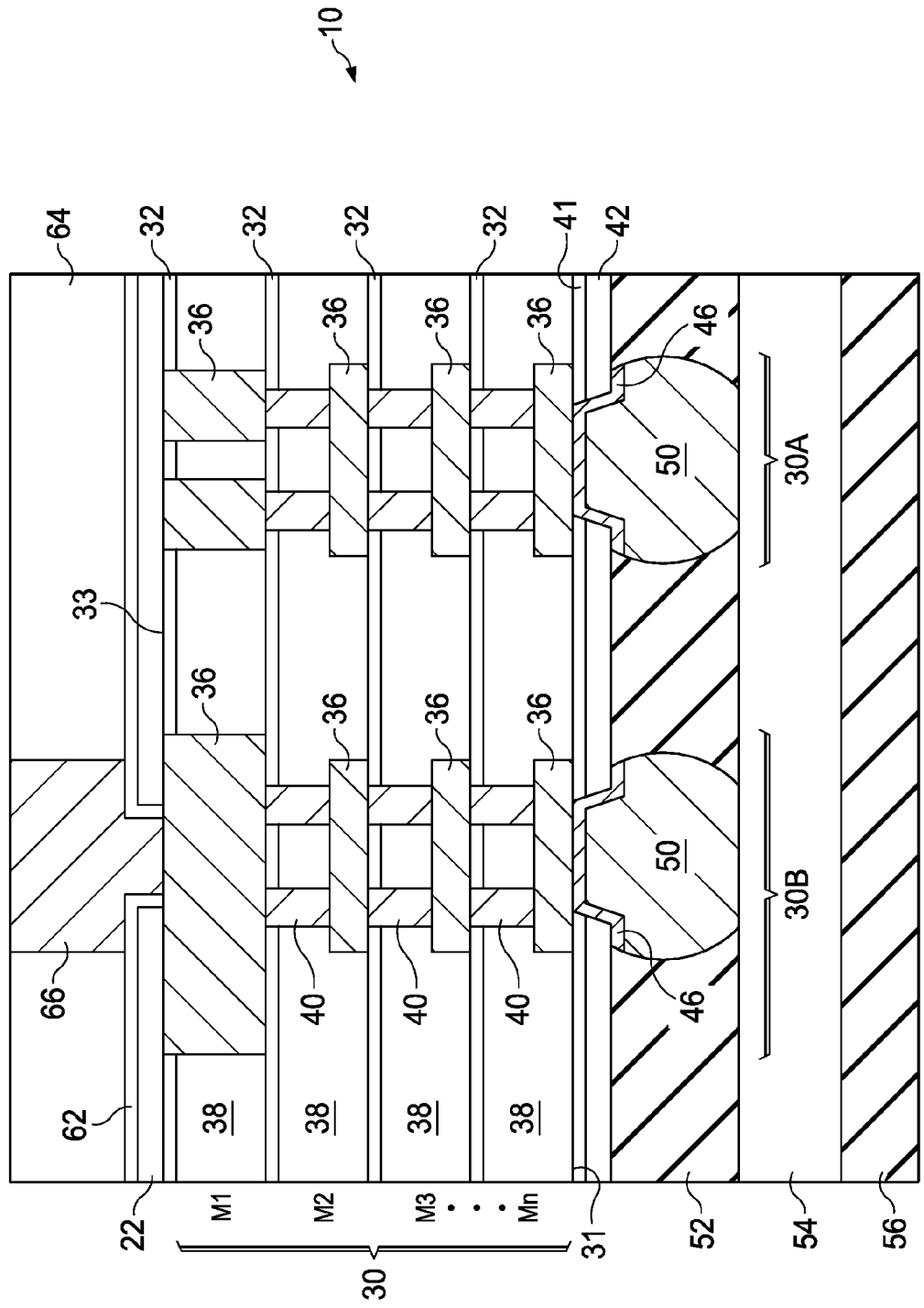

FIG. 2F illustrates the formation of the seed layer 62 over the passivation layer 22 and in the opening 60, a photoresist 64 over the seed layer 62, and a conductive material 66 over the metal line 36 of the metal layer M1. In some embodiments, one or more barrier layers (not shown) may be formed in the opening 60 and along the passivation layer 22 comprising titanium, titanium nitride, tantalum, tantalum nitride, the like, or a combination thereof. The one or more barrier layers may be formed by CVD, PVD, PECVD, ALD, the like, or a combination thereof. The seed layer 62 may comprise a titanium copper alloy or the like on the one or more barrier layers, if present, through CVD, sputtering, the like, or a combination thereof. The photoresist 64 may then be formed to cover the seed layer, and the photoresist may then be patterned to expose those portions of the seed layer that are located where the conductive material 66 is desired to be located. Once the photoresist has been formed and patterned, the conductive material 66, such as copper, aluminum, gold, nickel, silver, tin, the like, or a combination thereof may be formed on the seed layer through a deposition process such as plating, CVD, PVD, the like, or a combination thereof.

FIG. 2G illustrates the removal of the photoresist 64, the patterning of the seed layer 62, and the formation of the connector 68 from the conductive material 66. The photoresist 64 may be removed through a suitable removal process such as ashing. Additionally, after the removal of the photoresist 64, those portions of the seed layer 62 that were covered by the photoresist 64 may be removed through, for example, a suitable etch process using the conductive material 66 as a mask. The conductive material 66 may be shaped to form a connector 68 with a rounded top surface by performing a reflow process on the conductive material 66. In some embodiments, the connector 68 may be substantially aligned with one of the UBMs 46 and connectors 50 in the second portion 30B of the interconnecting structure 30 as illustrated in FIG. 2G. In other embodiments, there may be another connector 68 substantially aligned with another connector 50 in the first portion 30A of the interconnecting structure 30.

As illustrated in FIG. 2G, in some embodiments, there may be a plurality of semiconductor devices 10 formed adjacent each other over a top surface of the carrier 56. In these embodiments, after the formation of the connector 68, the carrier 56 may be demounted from the plurality of semiconductor devices 10. Next, semiconductor devices 10 may be sawed apart, so that the semiconductor devices 10 are separated from each other. In some embodiments, in order to saw the semiconductor devices 10, the plurality of semiconductor devices are attached on a dicing tape (not shown), and are diced when attached to the dicing tape.

At operation 212, a second side of the interconnecting structure may be bonded to a second substrate. Operation 212 is illustrated in FIG. 2H as described below.

Figure 2H:
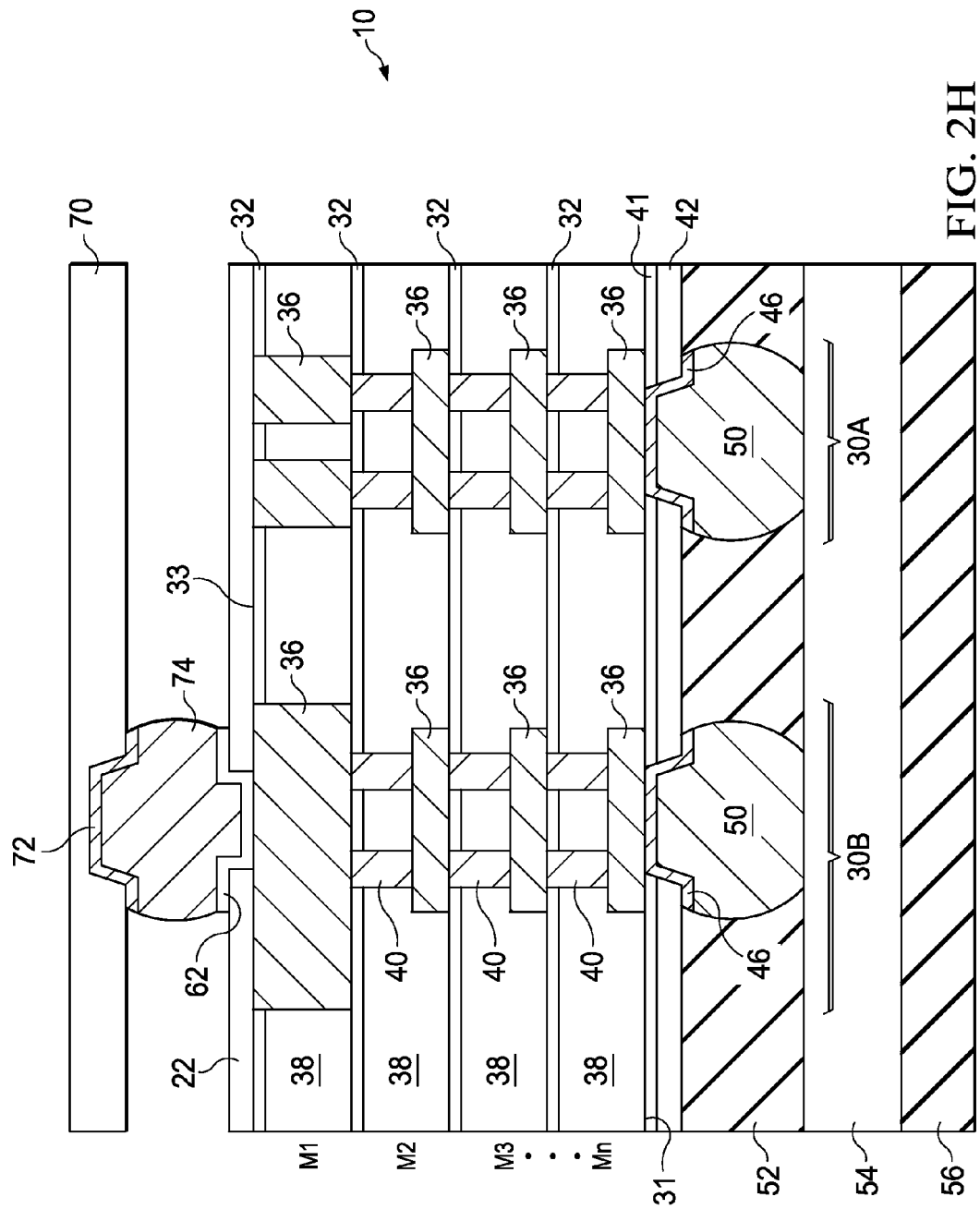

FIG. 2H illustrates bonding the second side 33 of the interconnecting structure 30 to a second substrate 70 by way of a bonding structure 74. The second substrate 70 may be similar to the first substrate 20 as described above, although the first substrate 20 and the second substrate 70 need not be the same. Second substrate 70 is, in one alternative embodiment, based on an insulating core such as a fiberglass reinforced resin core. One example core material is fiberglass resin such as FR4. Alternatives for the core material include bismaleimide-triazine (BT) resin, or alternatively, other PC board materials or films. Build up films such as Ajinomoto build-up film (ABF) or other laminates may be used for second substrate 70.

The second substrate 70 has a contact 72 which will be physically and electrically coupled to the connector 68. In some embodiments, the contact 72 may comprise a pre-solder layer, and in other embodiments, the contact 72 may comprise a bond pad or a UBM. The contact 72 may comprise solder, tin, silver, tin, the like, or a combination thereof. In an embodiment, the second substrate 70 may be bonded to the interconnecting structure 30 by a reflow process. During this reflow process, the contact 72 on the second substrate 70 is in contact with the connectors 68 to form a bonding structure 74 to physically and electrically couple the second substrate 70 to the interconnecting structure 30.

The number of bonding structures 74, the number of contacts 72, the number of UBMs 46, and the number of connectors 50 in FIG. 2H are only for illustrative purposes and are not limiting. There could be any suitable number of UBMs 46, bonding structures 74, connectors 50, and contacts 72.

Figure 3A:
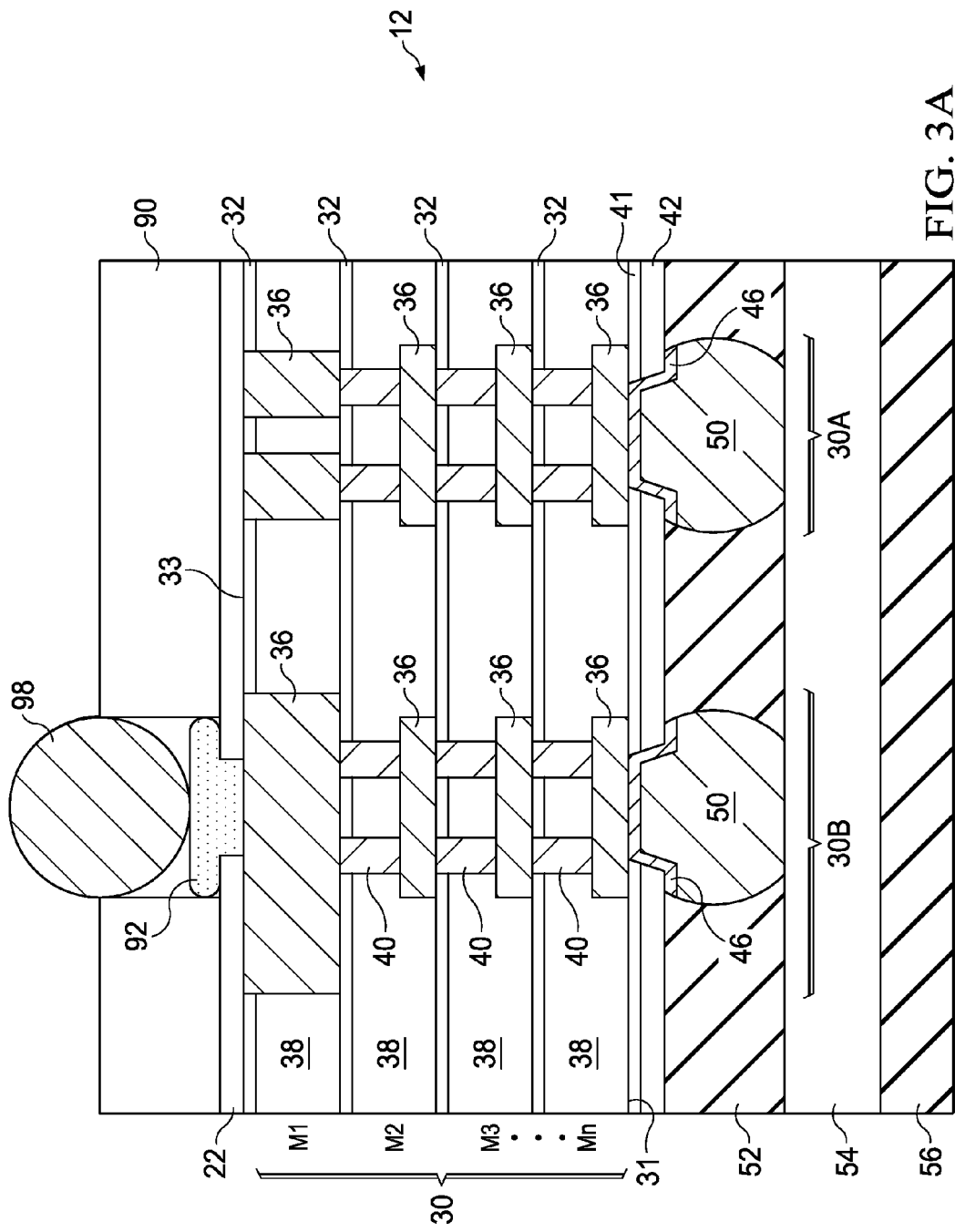
FIGS. 3A and 3B illustrate intermediate stages of forming a semiconductor device according to another embodiment.
Figure 3B:
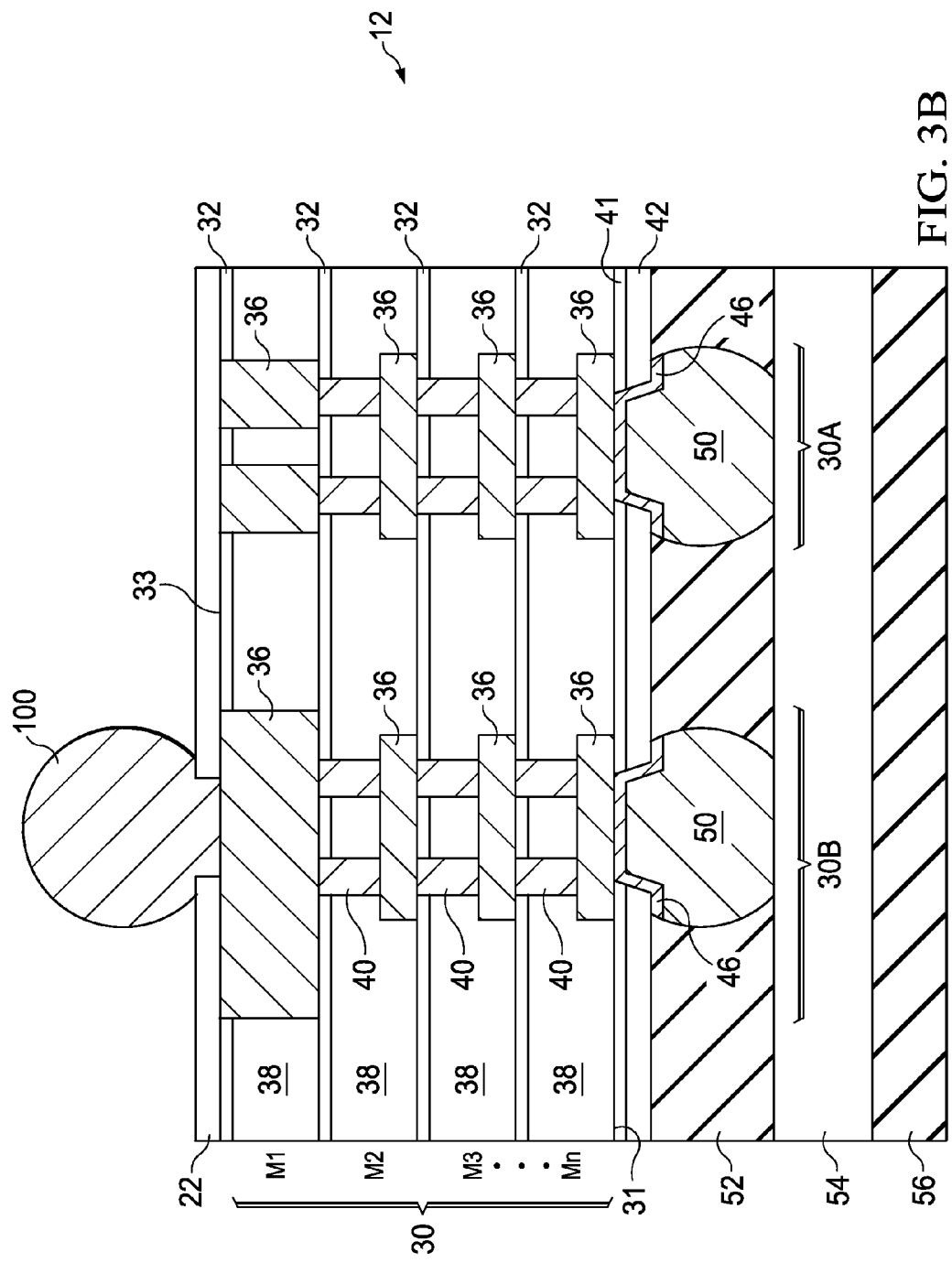

FIGS. 3A and 3B illustrate a semiconductor device 12 according to another embodiment, wherein the connector on the second side 33 of the interconnecting structure 30 is formed by a solder ball drop method. Details regarding this embodiment that are similar to those for the previously described embodiment will not be repeated herein.

FIG. 3A illustrates a semiconductor device 12 with a photoresist 90 on a passivation layer 22, flux 92 on the metal line 36 of the metal layer M1, and a solder ball 98 on the flux 92. In an embodiment, the flux 92 may be formed on the metal line 36 by dipping the metal line 36 in flux so that flux 92 may be deposited on the metal line 36 in the opening formed in the photoresist 90. In another embodiment, the flux 92 may be deposited as a paste and may be printed on the metal line 36 and in the opening formed in the photoresist 90. After the flux 92 is formed, a solder ball 98 is formed on the flux 92. The solder ball 98 may be formed by a solder ball drop process. The solder ball drop process is known in the art, and thus, is not detailed herein.

FIG. 3B illustrates the formation of the connector 100. The connector 100 may allow various other devices and/or substrates to be electrically coupled to the second side 33 of the interconnecting structure 30 (see FIG. 2H). The photoresist 90 may be removed through a suitable removal process such as ashing. The connector 100 is formed by performing a reflow process on the solder ball 98 and the flux 92. The connector 100 may cost less to form than the connector 68 of FIG. 2G. However, an embodiment with connector 68 may have better electrical migration properties than an embodiment with connector 100 due to intermetallic compounds near an interface with metal layer M1 of the connector 100 embodiment. The thermal cycling properties of the connector 100 are similar to the thermal cycling properties of the connector 68.

Figure 4:
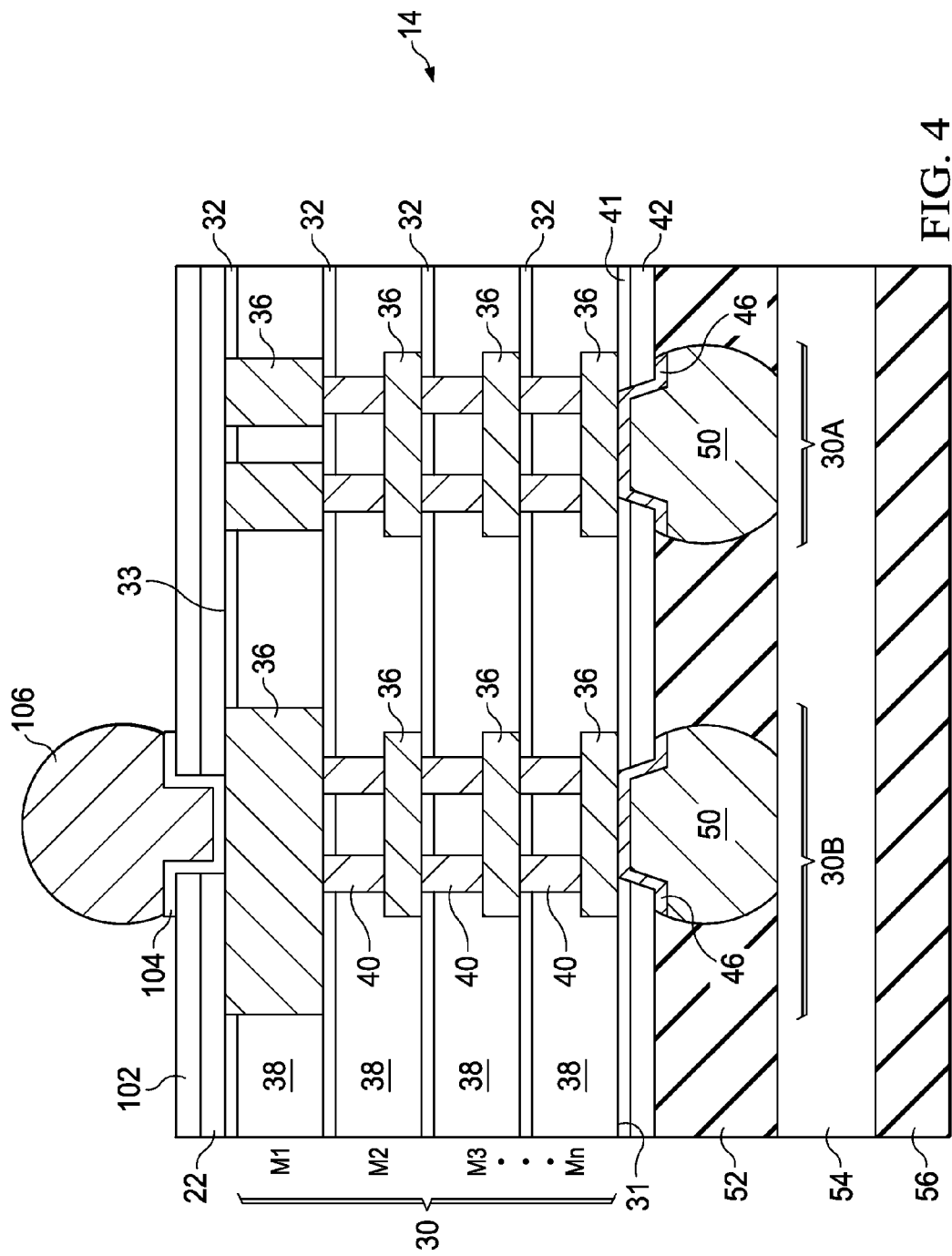
FIG. 4 illustrates a semiconductor device according to another embodiment.

FIG. 4 illustrates a semiconductor device 14 according to another embodiment, wherein the connector on the second side 33 of the interconnecting structure 30 includes a polymer layer on the passivation layer 22. Details regarding this embodiment that are similar to those for the previously described embodiment will not be repeated herein.

FIG. 4 illustrates a semiconductor device with a polymer layer 102 on the passivation layer 22. The polymer layer 102 may be formed of a polymer, such as an epoxy, polyimide, BCB, PBO, the like, or a combination thereof, although other relatively soft, often organic, dielectric materials can also be used. The polymer layer 102 may be formed by spin coating or other commonly used methods. After the polymer layer 102 is formed on the passivation layer 22, an opening may be formed through the polymer layer 102 and the passivation layer 22 to expose a portion of the metal line 36 of the metal layer M1. The opening may be performed as described above with reference to FIG. 2E and will not be repeated herein. A seed layer 104 may be deposited along the polymer layer 102 and in the opening over the metal line 36 and a connector 106 may be formed on the seed layer 104 and in the opening over the metal line 36 of the metal layer M1. The seed layer 104 and the connector 106 may be similar to the seed layer 62 and the connector 68 as described above with reference to FIGS. 2F and 2G and the description of them will not be repeated herein.

Figure 5:
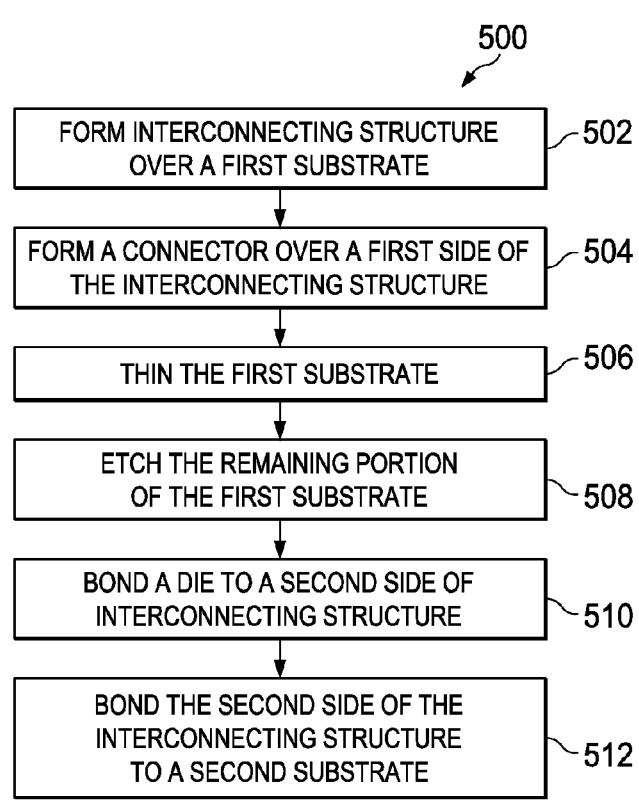
FIG. 5 illustrates a flow diagram of a method for manufacturing a semiconductor device according to another embodiment.

FIG. 5 illustrates a flow diagram of a method 500 for manufacturing a semiconductor device in accordance with an embodiment. While method 500 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The operations of method 500 will be described with reference to FIGS. 6A through 6D as an example, although the method 500 may be applied to other embodiments.

At operation 502, an interconnecting structure is formed over a first substrate. At operation 504, a connector is formed over a first side of the interconnecting structure 30. Operations 502 and 504 are illustrated in FIG. 6A as described below.

Figure 6A:
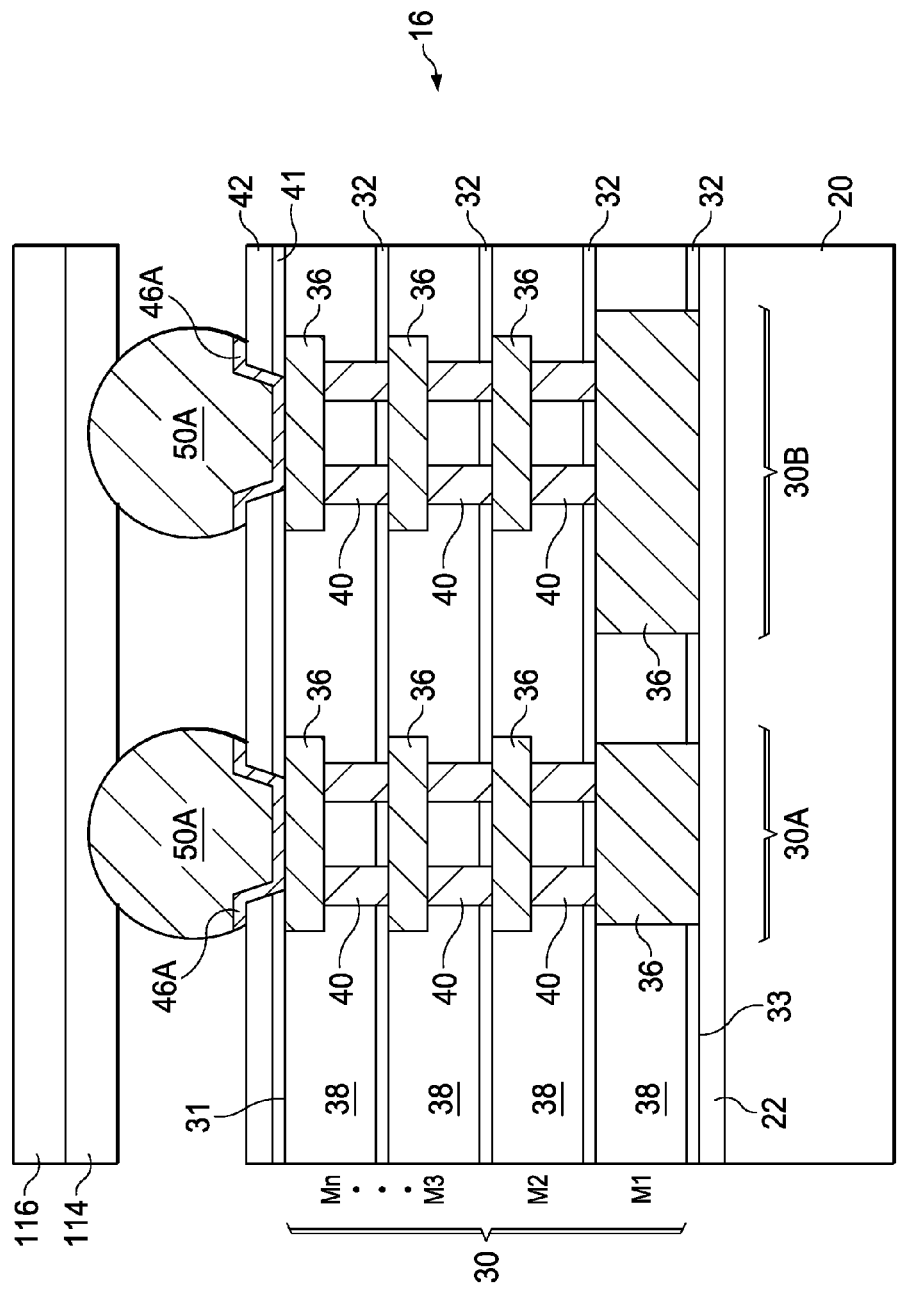
FIGS. 6A through 6D illustrate intermediate stages of forming a semiconductor device according to another embodiment.

FIG. 6A illustrates a semiconductor device 16 at an intermediate stage of processing according to an embodiment. The semiconductor device 16 includes a passivation layer 22 formed on a first substrate 20, an interconnecting structure 30 formed on the passivation layer 22, first and second passivation layers 41 and 42 over the interconnecting structure 30, UBMs 46A formed in openings and along the first and second passivation layers 41 and 42, connectors 50A formed over the second passivation layer 42 and in electrical contact with the first side 31 of the interconnecting structure, and a carrier 116 mounted to the connectors 50A with an adhesive layer 114. UBMS 46A may be similar to UBMS 46 and connectors 50A may be similar to connectors 50 described above and the descriptions will not be repeated herein. Details regarding this embodiment that are similar to those for the previously described embodiment will not be repeated herein.

A carrier 116 may then be mounted to the connectors 50A through an adhesive layer 114. The adhesive layer 114 may be disposed, for example laminated, on the carrier 116. The adhesive layer 114 may be formed of a glue, such as an ultra-violet glue, or may be a lamination layer formed of a foil. The carrier 116 may be any suitable substrate that provides (during intermediary operations of the fabrication process) mechanical support for the layers on top. The carrier 116 may comprise a wafer comprising glass, silicon (e.g., a silicon wafer), silicon oxide, metal plate, a ceramic material, or the like.

At operation 506, the first substrate is thinned. Operation 506 is illustrated in FIG. 6B as described below.

Figure 6B:
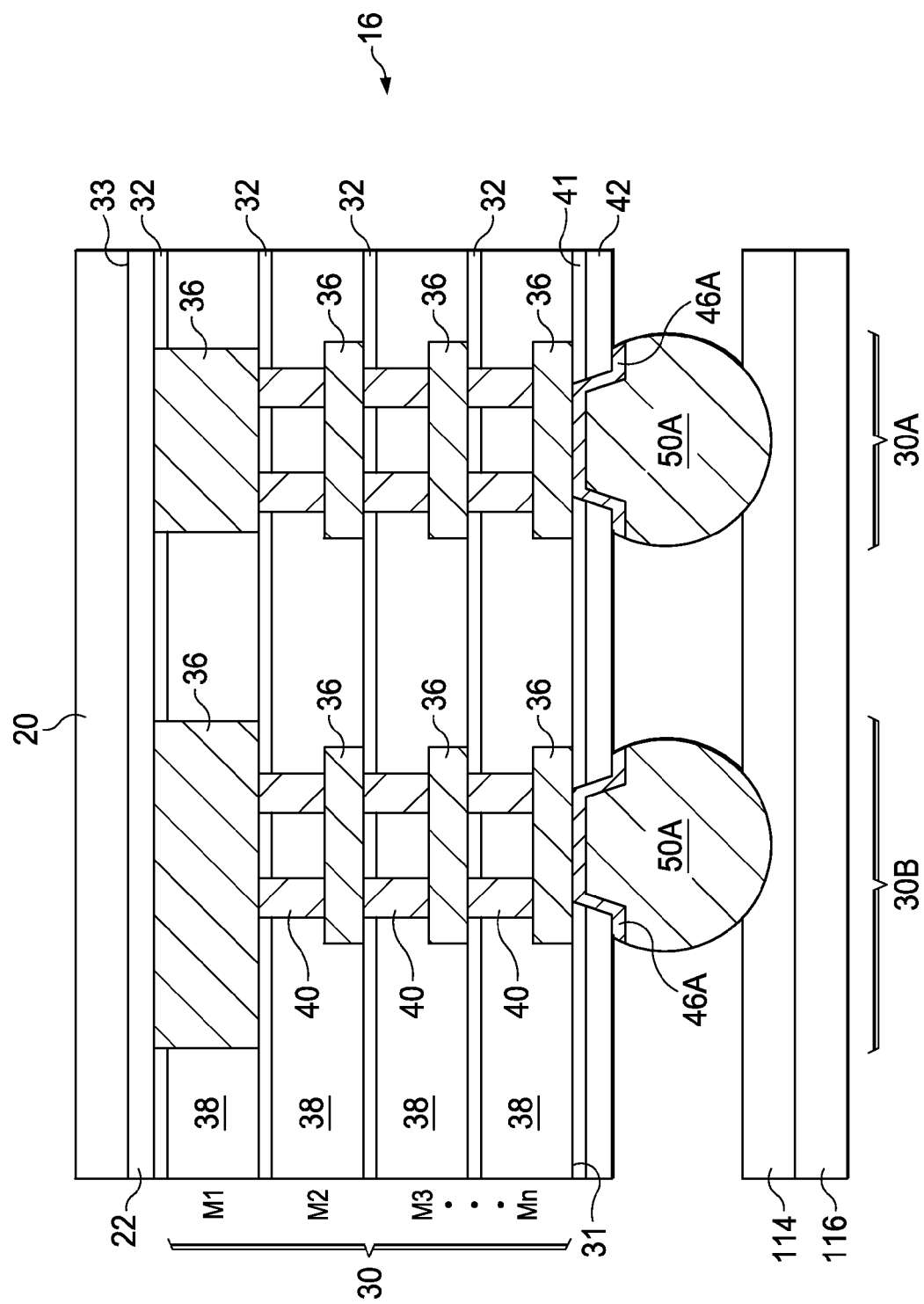

FIG. 6B illustrates the thinning of the first substrate 20. In FIG. 6B, the semiconductor device 16 has been flipped over so that the carrier 116 is towards the bottom of the figure. The thinning process of the first substrate 20 may be similar to the process described above with reference to FIG. 2C and the description of them will not be repeated herein.

At operation 508, the remaining portions of the first substrate 20 may be removed. Operation 508 is illustrated in FIG. 6C.

Figure 6C:
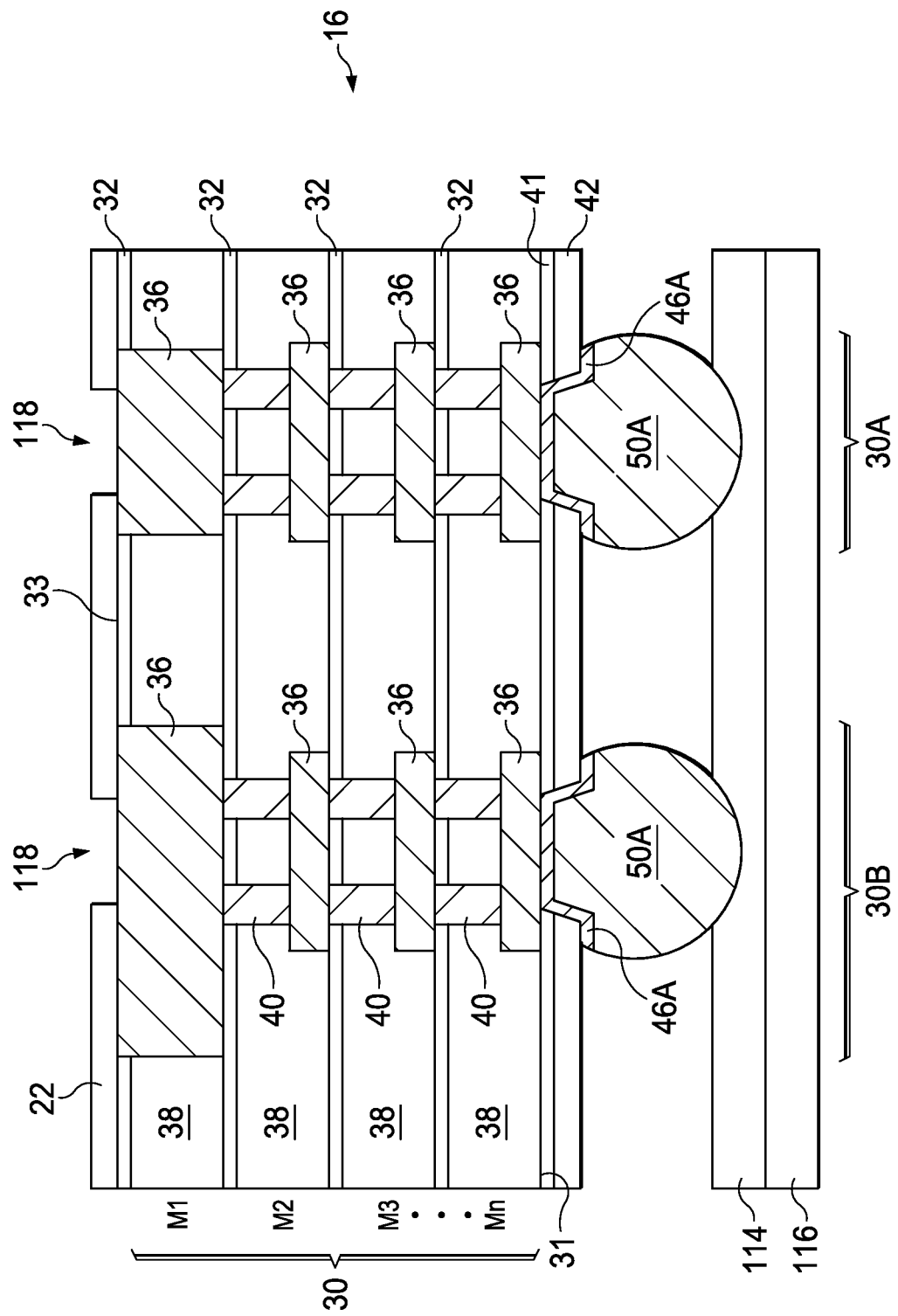

FIG. 6C illustrates the removal of the remaining portion of the first substrate 20 and the forming of openings in the passivation layer 22 to expose portions of the metal lines 36 of the metal layer M1. The removal of the remaining portion of the first substrate 20 may be similar to the process described above with reference to FIG. 2D and the description will not be repeated herein. The openings 118 allow for electrical and physical coupling between the metal lines 36 of metal layer M1 of the interconnecting structure 30 and the subsequently formed UBMs 46. These openings may be formed using a suitable photolithographic mask and etching process, although any suitable process to expose portions of the metal lines 36 of metal layer M1 may be used.

At operation 510, a die is bonded to the second side of the interconnecting structure. Operation 510 is illustrated in FIG. 6D as described below.

Figure 6D:
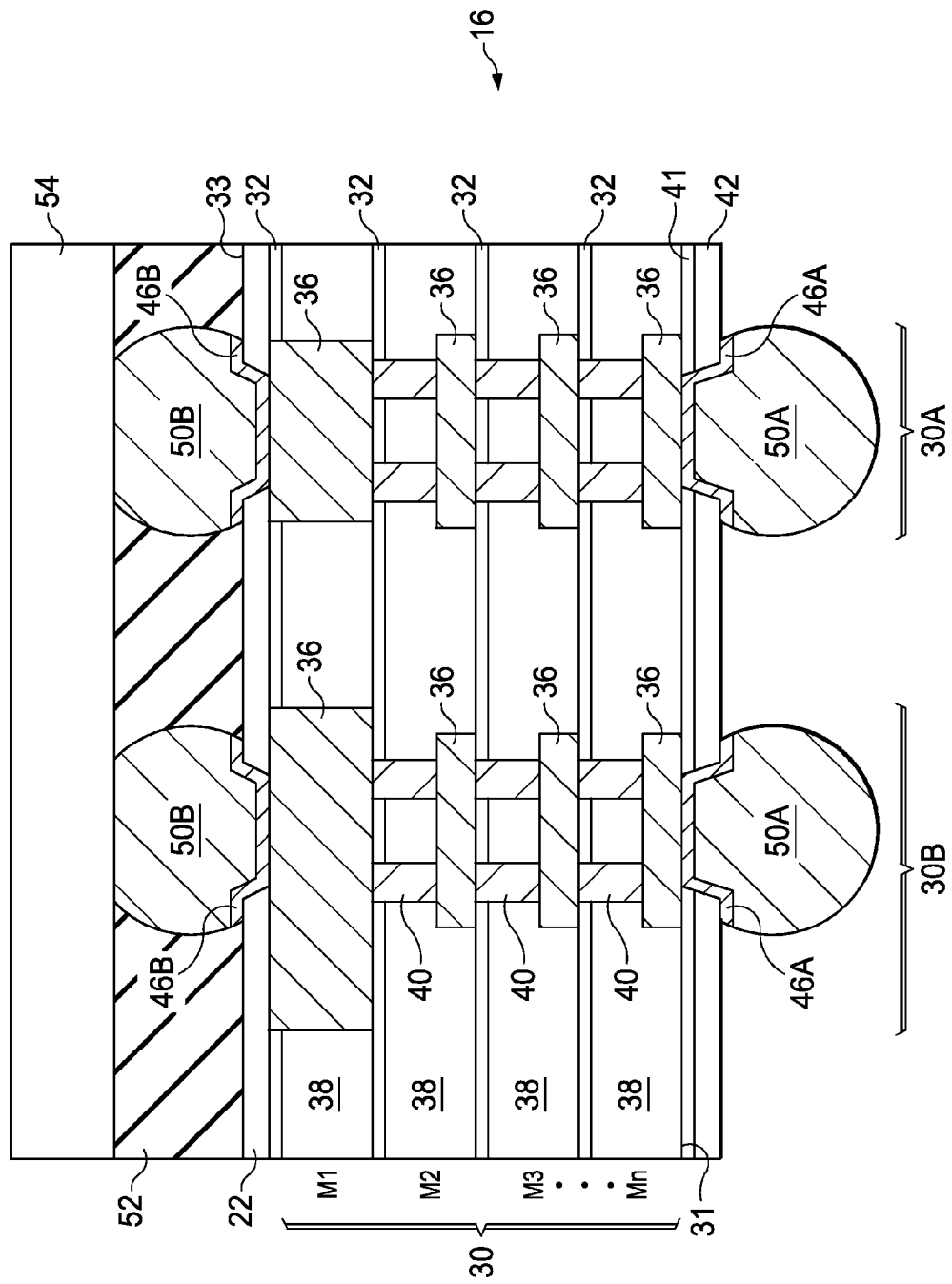

FIG. 6D illustrates the formation of the UBMs 46B along the passivation layer 22 and in the openings 118. The UBMs 46B are formed electrically contacting the metal lines 36 of the metal layer M1. The UBMs 46B may be similar to the UBMs 46 described above with reference to FIG. 2A and the description of them will not be repeated herein.

After the UBMs 46B are formed, the die 54 may be bonded to the second side 33 of the interconnecting structure 30 by way of connectors 50B with an underfill material 52 between the die 54 and the passivation layer 22. The die 54 and the process of bonding the die to the interconnecting structure 30 were described above with reference to FIG. 2A and the description of them will not be repeated herein. The connectors 50B may be similar to connectors 50 described above and the description will not be repeated herein, although connectors 50A and connectors 50B need not be the same.

At operation 512, the first side of the interconnecting structure may be bonded to a second substrate. Operation 512 may be similar to the process described above with reference to FIG. 2H except that this operation bonds the first side 31 of the interconnecting structure 30 to the second substrate rather than the second side 33 of the interconnecting structure 30 as described above. Thus, the description of this operation will not be repeated herein.

By having an interconnecting structure 30 coupling the die 54 to the second substrate 70, the cost of the semiconductor device 10 may be much lower than other devices. Because the interconnecting structure 30 does not have a substrate, through substrate vias (TSVs) are not necessary to couple the die 54 to the second substrate 70, and TSVs are a significant cost in other devices. However, the yield, reliability, and performance of the interconnecting structure 30 are not impacted by the removal of the substrate and/or the lack of TSVs.

An embodiment is a semiconductor device comprising an interconnecting structure consisting of a plurality of thin film layers and a plurality of metal layers disposed therein, each of the plurality of metal layers having substantially a same top surface area, and a die comprising an active surface and a backside surface opposite the active surface, the active surface being directly coupled to a first side of the interconnecting structure. The semiconductor device further comprises a first connector directly coupled to a second side of the interconnecting structure, the second side being opposite the first side.

Another embodiment is a semiconductor device comprising an interconnecting structure, the interconnecting structure comprising a first metal line disposed in a first dielectric layer, the first metal line having a first surface substantially coplanar with a first side of the interconnecting structure, a second metal line disposed in a second dielectric layer, the second metal line having a second surface substantially coplanar with a second side of the interconnecting structure, the second side being opposite the first side, and a set metal lines extending from the first metal line to the second metal line, each of the set of metal lines disposed in a dielectric layer. The semiconductor device further comprises a first connector contacting the first metal line, a die comprising an active surface and a backside surface opposite the active surface, the active surface comprising a second connector, the second connector being electrically coupled to the first connector, the active surface being substantially parallel to the first surface and the second surface, and a third connector contacting the second metal line.

Yet another embodiment is a method of forming a semiconductor device, the method comprising forming an interconnecting structure over a first substrate, the interconnecting structure comprising a plurality of metal layers disposed in a plurality of thin film dielectric layers, and bonding a die to a first side of the interconnecting structure. The method further comprises etching the first substrate from a second side of the interconnecting substrate, and forming a first connector over the second side of the interconnecting structure, the first connector coupled to at least one of the plurality of metal layers.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and operations described in the specification. As one of ordinary skill in the art will readily appreciate from the disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A semiconductor device comprising:
an interconnecting structure consisting of a plurality of thin film layers and a plurality of metal layers disposed therein, each of the plurality of metal layers having substantially a same top surface area, the interconnecting structure having a first side and a second side, each of the first side and the second side being substantially planar, the first side comprising a major surface of a first thin film layer of the plurality of thin film layers and a first surface of the respective metal layer of the plurality of metal layers disposed in the first thin film layer, the major surface of the first thin film layer and the first surface of the respective metal layer facing a first direction, the second side comprising a major surface of a second thin film layer of the plurality of thin film layers and a second surface of the respective metal layer of the plurality of metal layers disposed in the second thin film layer, the major surface of the second thin film layer and the second surface of the respective metal layer facing a second direction, the second direction being opposite the first direction, the plurality of metal layers being between the first side and the second side of the interconnecting structure;
a die comprising an active surface and a backside surface opposite the active surface, the active surface being directly coupled to the first side of the interconnecting structure; and
a first connector directly coupled to the second side of the interconnecting structure, the second side being opposite the first side.

2. The semiconductor device of claim 1, wherein the interconnecting structure is free from through substrate vias.

3. The semiconductor device of claim 1, wherein the interconnecting structure is free from active and passive devices.

4. The semiconductor device of claim 1 further comprising a first substrate directly coupled to the first connector.

5. The semiconductor device of claim 1, wherein the first connector comprises a solder ball, a metal pillar, a micro bump, or a controlled collapse chip connection bump.

6. The semiconductor device of claim 1 further comprising:
a second connector directly coupled to the first side of the interconnecting structure;
a third connector directly coupled to the active surface of the die, the second connector and the third connector directly coupled together; and an underfill surrounding the second and third connectors, the underfill being between the active surface of the die and the first side of the interconnecting structure.

7. The semiconductor device of claim 1, wherein each of the plurality of metal layers comprises a metal line and a metal via, the metal line and metal via being disposed in an inter-metal dielectric.

8. A semiconductor device comprising:
an interconnecting structure, the interconnecting structure comprising:
a first metal line disposed in a first dielectric layer, the first metal line having an upper surface substantially coplanar with an upper surface of the first dielectric layer, the upper surface of the first metal line being a first side of the interconnecting structure;
a second metal line disposed in a second dielectric layer, the second metal line having a lower surface substantially coplanar with a lower surface of the second dielectric layer, the lower surface of the second metal line being a second side of the interconnecting structure, the first metal line and the second metal line being substantially aligned; and
a set of metal lines disposed in a region extending from the first metal line to the second metal line, each of the set of metal lines disposed in a respective dielectric layer;
a first passivation layer on the first side of the interconnecting structure, the first passivation layer having a substantially planar surface, the substantially planar surface of the first passivation layer directly adjoining the first metal line and the first dielectric layer;
a second passivation layer on the second side of the interconnecting structure, the second passivation layer having a substantially planar surface, the substantially planar surface of the second passivation layer directly adjoining the second metal line and the second dielectric layer;
a first connector extending through the first passivation layer and contacting the first metal line;
a die comprising an active surface and a backside surface opposite the active surface, the active surface comprising a second connector, the second connector being electrically coupled to the first connector, the active surface being substantially parallel to the upper surface of the first metal line and the upper surface of the second metal line; and
a third connector extending through the second passivation layer and contacting the second metal line, the first connector and the third connector being substantially aligned.

9. The semiconductor device of claim 8, wherein the interconnecting structure is free from through substrate vias.

10. The semiconductor device of claim 8, wherein the interconnecting structure is free from active and passive devices.

11. The semiconductor device of claim 8, wherein the set of the metal lines further comprises:
a third metal line disposed in a third dielectric layer, the third metal line having an upper surface substantially parallel with the upper surfaces of the first and second metal lines, the third metal line being coupled to the first metal line by a first via; and
a fourth metal line disposed in a fourth dielectric layer, the third and fourth metal lines being between the first metal line and the second metal line, the fourth metal line having an upper surface substantially parallel with the upper surfaces of the first, second, and third metal lines, the fourth metal line being coupled to the second metal line by a second via and the fourth metal line being coupled to the third metal line by a third via.

12. The semiconductor device of claim 8 further comprising a substrate over the second side of the interconnecting structure, the substrate having a contact, the contact coupled to and directly contacting the third connector.

13. The semiconductor device of claim 12, wherein the third connector comprises a controlled collapse chip connection bump and the contact comprises a pre-solder layer.

14. The semiconductor device of claim 8, wherein the first metal line, the second metal line, and each of the set of the metal lines have top surface areas that are substantially equal.

15. The semiconductor device of claim 8 further comprising:
a polymer layer on the second passivation layer, the third connector extending along the polymer layer and extending through the polymer layer and the second passivation layer to contact the second metal line.

16. The semiconductor device of claim 1, wherein each of the plurality of thin film layers comprises an etch stop layer and an inter-metal dielectric (IMD).

17. A semiconductor device comprising:
an interconnecting structure consisting of a plurality of thin film layers and a plurality of metal layers disposed therein, the interconnecting structure having a first side and a second side, the first side comprising a first metal layer of the plurality of metal layers and a first thin film layer of the plurality of thin film layers, the first metal layer having an upper surface substantially coplanar with an upper surface of the first thin film layer, the second side comprising a second metal layer of the plurality of metal layers and a second thin film layer of the plurality of thin film layers, the second metal layer having a lower surface substantially coplanar with a lower surface of the second thin film layer, the interconnecting structure being free from active and passive devices;
a die comprising an active surface and a backside surface opposite the active surface, the active surface being directly coupled to the first side of the interconnecting structure; and
a first connector directly coupled to the second side of the interconnecting structure, the second side being opposite the first side.

18. The semiconductor device of claim 17, wherein the interconnecting structure is free from through substrate vias.

19. The semiconductor device of claim 17 further comprising a first substrate directly coupled to the first connector, the first connector comprising a solder ball, a metal pillar, a micro bump, or a controlled collapse chip connection bump.

20. The semiconductor device of claim 17 further comprising:
a second connector directly coupled to the first side of the interconnecting structure;
a third connector directly coupled to the active surface of the die, the second connector and the third connector directly coupled together; and
an underfill surrounding the second and third connectors, the underfill being between the active surface of the die and the first side of the interconnecting structure.

21. The semiconductor device of claim 17, wherein each of the plurality of thin film layers comprises an etch stop layer and an inter-metal dielectric (IMD).

22. The semiconductor device of claim 21, wherein each of the plurality of metal layers have substantially a same top surface area and comprises a metal line and a metal via, each of the metal lines being disposed in an IMD and each of the metal vias being disposed in an etch stop layer and an IMD.

* * * * *